United States Patent [19]

Yerbury et al.

[11] Patent Number: 5,172,075
[45] Date of Patent: Dec. 15, 1992

[54] SELF-CALIBRATING TEMPERATURE-COMPENSATED FREQUENCY SOURCE

[75] Inventors: Michael J. Yerbury; Geoffrey D. Sizer, both of Pymble, Australia

[73] Assignee: Advanced Systems Research Pty. Limited, Pymble, Australia

[21] Appl. No.: 834,230

[22] PCT Filed: Jun. 22, 1990

[86] PCT No.: PCT/AU90/00269
§ 371 Date: Feb. 21, 1992
§ 102(e) Date: Feb. 21, 1992

[87] PCT Pub. No.: WO90/16113
PCT Pub. Date: Dec. 27, 1990

[30] Foreign Application Priority Data

Jun. 22, 1989 [AU] Australia .................... PJ4865

[51] Int. Cl.⁵ .......................... H03L 1/02; H03L 7/06
[52] U.S. Cl. ...................................... 331/14; 331/18; 331/176
[58] Field of Search .................... 331/14, 18, 176

[56] References Cited

U.S. PATENT DOCUMENTS 4,921,467  5/1990  Lax ................................ 331/176 X

Primary Examiner—Siegfried H. Grimm
Attorney, Agent, or Firm—Nikaido, Marmelstein, Murray & Oram

[57] ABSTRACT

A frequency source (1) in, for example, a remote unit in a mobile communications system, is controlled to maintain a stable frequency signal. In normal operation, the frequency source (1) is frequency locked to an external reference frequency (10). A temperature detecting device (2) monitors the temperature of the frequency source, and information relating to temperature is stored in a storage device (7) together with information relating to control signals (6) applied to the frequency source (1). In the absence of the reference frequency (10), the temperature of the frequency source (1) is detected and the stored information is used to generate a control signal (6) to control the output frequency of the frequency source (1) in accordance with the detected temperature.

27 Claims, 1 Drawing Sheet

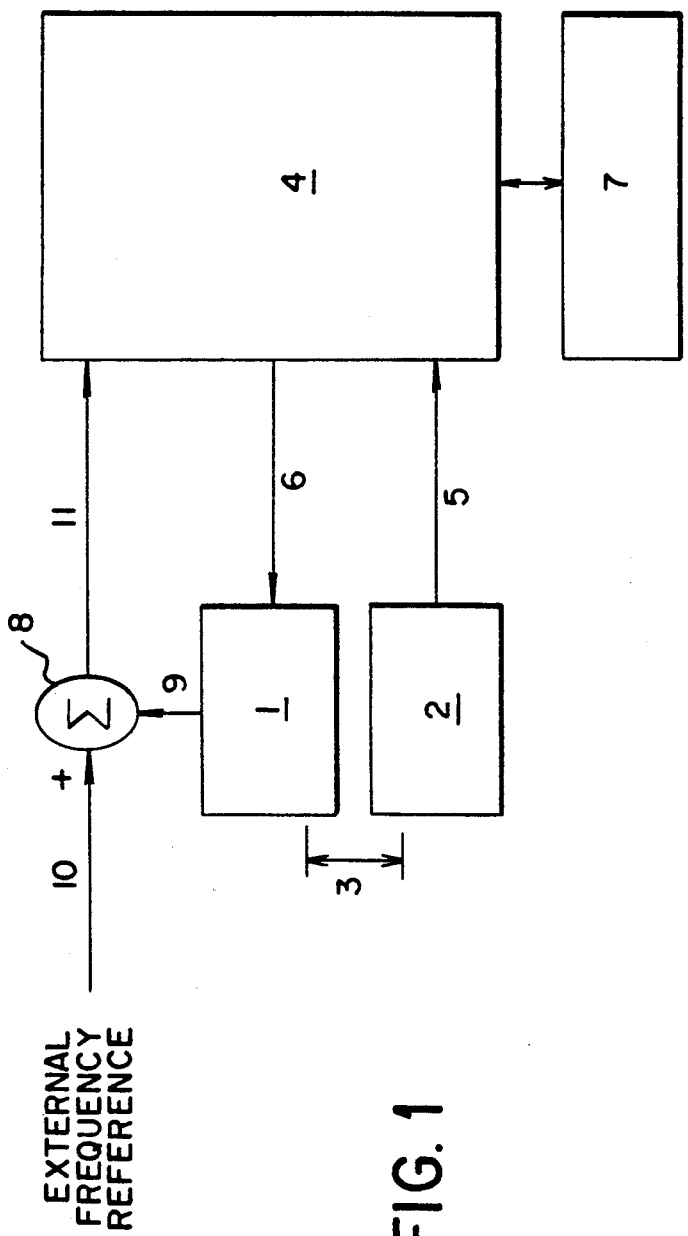

SELF-CALIBRATING TEMPERATURE-COMPENSATED FREQUENCY SOURCE

The present invention relates to a self-calibrating temperature-compensated frequency source, and, particularly but not exclusively, to a method and apparatus of maintaining an operating frequency of a frequency source, which is normally locked to a received external reference frequency, when said external reference frequency is not being received.

In, for example, a radio communication system, the carrier frequency is one of a number of parameters used to specify the system. Accurate knowledge of the carrier frequency of a received signal can enhance the performance of a system to a degree depending on the signal processing techniques employed. In the case of mobile communication systems, for example, the remote unit (e.g. car phone) is desirably inexpensive, small and lightweight, has low power consumption and transmits a relatively low power signal. Also, the base station frequency has to process weak signals in a noisy radio environment.

Such mobile communication systems could benefit significantly in performance if the remote unit contained an accurate frequency source from which the carrier frequency could be derived. However, many of the characteristics of highly accurate frequency sources make them unsuitable for mobile applications; notably these sources possess one or more of the following attributes:

(a) appreciable size and weight
(b) high power consumption
(c) high cost.

Further, due to the plethora of systems and services competing for access to a limited range of radio frequencies available, there is an increasing need to improve the efficiency of use of the electro-magnetic spectrum, by allowing an increased number of users to access a given band of frequencies. For example, in the mobile radio area, there is a trend towards the use of closer channel spacing with reduced guard bands between adjacent channels, implying the need for accurate frequency control if unacceptably high levels of mutual interference are to be avoided. The satisfactory operation of new services such as cellular telephone systems is dependent on accurate frequency control, and the future trend is likely to be towards a requirement for increasing levels of frequency accuracy for the signals transmitted by the remote units in such systems. Also, commercial pressures are tending to require equipment to be low-cost, small, lightweight and with low power consumption.

It is known to maintain accuracy of a frequency signal of a remote unit by locking the frequency signal to an external reference frequency signal which is received by the remote unit from a base transmitter station. As long as the external reference frequency signal is being received, reasonable frequency accuracy of the remote unit frequency source can be maintained. The remote unit is therefore able to transmit, when necessary, within the correct band of frequencies for the particular specification.

However, there are times when it will not be possible for the remote unit to receive the external reference signal, e.g. when the remote unit is out of range of the base signal transmitter or when there is an obstruction between the base transmitter and the remote unit which prevents transmission reaching the remote unit. If the remote unit is then required to transmit, it will be capable of maintaining the required level of frequency accuracy only for as long as its local frequency source does not drift from the locked setting by more than allowable limits (Note that in generally known systems the stimulation which causes the remote unit to transmit will have been generated locally, as the control signalling which would normally be used to stimulate transmission is not being received).

For a remote unit which, due to requirements of cost effectiveness, uses an inexpensive uncompensated crystal oscillator as its frequency source, a substantial amount of frequency drift can occur due to changes in the temperature of the crystal and associated components. With the highly specific frequency requirements discussed above, temperature changes may cause the frequency source to drift outside of the required limits. Superimposed on the short term temperature variation will be long term aging effects, introducing frequency drift at a rate of typically 1 ppm (parts per million) per year for a crystal oscillator. A typical crystal oscillator using an SC-cut crystal will exhibit a frequency versus temperature characteristic which follows a cubic relationship with an overall variation in the range $-30°$ C. to $+85°$ C. of $+$ or $-15$ ppm.

As the frequency versus temperature characteristic is cubic, the maximum slope of the characteristic is significantly greater than would be the case for a linear characteristic. Typically the maximum slope may be as high as 0.5 ppm per $°$ C. Therefore it will only require a small temperature change when the remote unit is not receiving the external frequency reference signal for the local frequency signal to drift substantially, and possibly outside the required range. This order of temperature change could occur in a very short time, especially in the case of a remote unit which has been stationary (perhaps in a sheltered environment) and then becomes mobile.

Temperature compensated crystal oscillators are available. These are generally calibrated in the factory by scanning the oscillator through a predetermined temperature range and plotting the compensation necessary to maintain the stable frequency output as the temperature changes. The problem with this type of oscillator is that it is moderately expensive due to the need to perform this calibration step in the factory and also as the crystal ages some frequency drift will occur which is not compensated for by the predetermined temperature compensation. These oscillators will therefore tend to drift anyway over a period of time, and to maintain accuracy it is necessary to send them back to the factory for recalibration at regular intervals.

There is therefore a need for a frequency source which can maintain a stable frequency even when it is not receiving an external reference frequency, and does not need to be regularly taken out of use for recalibration.

The present invention relates generally to a temperature-compensated frequency source which is arranged to be self calibrating while actually in operation when receiving an external reference frequency signal, so that when the external reference frequency is no longer available it can utilise the calibration information to perform frequency control.

The present invention provides a method of operating a frequency source, comprising the steps of:

receiving an external reference frequency signal when available and controlling the frequency source to lock the operating frequency of the frequency source to the reference frequency signal;

during operation of said frequency source when said external reference frequency is being received, detecting temperature of the frequency source and storing temperature information relating to detected temperatures and control information relating to control settings required to maintain frequency lock for the detected temperatures; and when said external reference frequency signal is not being received, detecting the temperature of said frequency source and utilising the stored temperature and control information to provide a control setting in accordance with the detected temperature, for controlling the operating frequency of the frequency source.

The in-field calibration operation has the advantage that the device may still be in use when the calibration is occurring and means that it will not have to be taken out of use and sent back to a factory in order to be recalibrated. It has the further advantage that the operation automatically compensates for aging of the crystal as calibration may continuously be updated as the frequency source is being used.

Temperature and control information is preferably stored in the form of a look-up table, in, for example, a memory such as a non-volatile memory. For example, a temperature reading may be taken at a detected temperature of the frequency source and stored in the non-volatile memory, together with the frequency control setting necessary to maintain the frequency output signal in lock with the external frequency reference at that temperature. The frequency setting may be the setting to control, for example, a voltage controlled oscillator which accesses the frequency source.

The stored look-up table will therefore contain a number of discrete temperatures and associated control values, and can be used to provide the correct control value for an actual detected temperature when the external frequency reference is not being received.

Information regarding the age of any stored temperature and control information is also preferably available. This "age information" can be used to determine whether updating of stored information is necessary e.g. only information over a predetermined age is updated. Further, if a stored value is over a predetermined age it may not be used in the providing of the control setting.

In view of limitations which may occur with regard to the amount of information it is possible to store, it is preferable that temperature and control information is only stored in relation to predetermined nominal detected temperature values. For ease of calibration, temperature and control information readings are preferably taken when the actual detected temperature value falls within a predetermined range of the predetermined nominal detected temperature value, i.e. the detected temperature does not exactly have to coincide with the nominal detected temperature value for a reading to be taken. In this case, it is preferred that the offset between the actual and nominal temperature value is taken and stored.

When the external frequency reference signal is not being received, it is preferred that the control setting is provided by taking a plurality of stored temperature and control information readings, in the vicinity of the actual detected temperature, and interpolating or extrapolating to find the control setting for the actual detected temperature in accordance with a predetermined algorithm. The predetermined algorithm is preferably a least-squares curve fitting algorithm which is suitable for the type of frequency source being used. For example, in common crystal oscillators the characteristic temperature/frequency curve is a cubic curve, and known cubic polynomial curve fitting techniques can be applied. For purposes of accuracy and to reduce errors a multi-point curve fitting technique is preferably utilised.

During the calibration step, where readings are taken for actual temperatures within a predetermined range of nominal detected temperature values, it is preferred that the predetermined range may be varied in accordance with the age of temperature and control information already stored. For example, if a stored temperature and control information reading is "outdated", according to predetermined criteria, the predetermined range about the particular nominal detected temperature value may be extended so that it would be more likely that a new reading will be taken to replace the outdated reading.

The present invention has the advantage that a frequency source e.g. of a remote unit in a cellular telephone system, may be maintained with reasonable accuracy for several days following isolation from the reference frequency transmission The present invention further provides apparatus for operating a frequency source, comprising;

means for receiving an external reference frequency signal when available;

control means for controlling the frequency source to lock the operating frequency thereof to the external reference frequency signal;

temperature detecting means for detecting the temperature of the frequency source;

storage means for storing, during operation of the frequency source, when said external reference frequency signal is being received, temperature information relating to detected temperatures and control information relating to control settings required to maintain frequency lock for the detected temperatures; and control setting providing means for providing a control setting to control the operating frequency of the frequency source when no external reference frequency signal is being received, said control setting means utilising the stored temperature and control information to provide the control setting in accordance with the detected temperature.

The apparatus of the present invention may have the same advantageous features as discussed in relation to the above method.

Features and advantages of the present invention will become apparent from the following description of an embodiment thereof, by way of example only, with reference to the accompanying drawings in which:

FIG. 1 shows a schematic block circuit diagram of apparatus in accordance with an embodiment of the present invention for illustrating an embodiment of a method in accordance with the present invention; and FIG. 2 is a schematic diagram illustrating a method of storing data in accordance with the embodiment of FIG. 1.

Referring to FIG. 1, there is schematically illustrated apparatus which may form part of a remote unit which, for example, may be part of a mobile communications system. The apparatus comprises a frequency source 1, which may, for example, be a voltage controlled crystal oscillator of known type. It also includes a temperature measuring device 2 which is thermally coupled 3 to temperature sensitive components of the frequency source. The temperature measuring device 2 and frequency source 1 are connected to control means 4. The control means 4 is arranged to receive temperature readings 5 and to provide a control output 6 to control the frequency source. Data for use by control means 4 is stored in memory 7 which may include a non-volatile memory. Reference numeral 8 discloses a circuit for subtracting a frequency output 9 of said frequency source 1 from an external reference frequency 10 to produce a frequency error reading 11.

In operation, the apparatus is provided with means, such as an aerial, (not shown) for receiving an external reference frequency signal. The output 9 of the frequency source 1 is locked to the external reference frequency signal 10. Methods for locking an output frequency of a frequency source to an external reference frequency signal are known and therefore will not be described in detail here, as the present invention relates to self-calibration and temperature compensation not to methods of frequency lock. Briefly, however, the output frequency 9 of the frequency source 1 is subtracted from the received and detected external reference frequency 10 in subtraction circuit 8 to give an output which represents an error frequency 11. The error frequency 11 is input to the control means 4, which includes means for determining whether the error frequency 11 corresponds to a desired predetermined error frequency. If it does so correspond then the frequency output 9 of the frequency source 1 is of the correct value. However, if it does not correspond, the control means 4 acts to adjust the frequency control output 6 to cause the output frequency 9 of the frequency source 1 to be adjusted until the error frequency 11 does correspond with the predetermined desired error frequency. This is a standard negative feedback technique and it will be appreciated that it can be implemented in a number of ways.

The external reference frequency signal may be transmitted in a number of known forms. For example, it may be transmitted as a continuous signal or it may be transmitted as a frequency burst together with information which allows the remote unit to detect the frequency burst and extract the reference frequency information. Such frequency bursts would be transmitted on a regular basis in order to maintain frequency lock. The reference frequency is preferably automatically received by the remote unit. However, in some cases it may be necessary to perform a user operation to receive the signal, e.g. press a control button. The output frequency 9 may or may not be the same value as the reference frequency value. It could, for example, be any multiple or sub multiple value of the reference frequency.

A full treatment of techniques for frequency locking to an external reference frequency signal is beyond the scope of the present invention.

The process of this embodiment of the present invention can be divided into two major parts:

(1) Self-calibration
(2) Production of frequency control output when the external reference frequency signal is not present.

In the illustrated embodiment self-calibration occurs automatically and continually.

Briefly, when the external reference frequency signal is being received, the temperature measurement device 2 detects the temperature of the temperature sensitive components of the frequency source 1 over a period of time as the frequency source is being used. The detected temperature readings are input to the control means 4 which cause the detected temperatures to be stored in storage device 7 together with associated control information representing the value of the control output 6 necessary to maintain frequency lock for the particular detected temperature.

When the external reference frequency signal is no longer being received, the present temperature of the frequency source 1 is measured by the temperature measuring means 2 and input to the control means 4. The control means has reference to the memory means 7 and extracts control information for producing a control output 6 to maintain the output frequency 9 of the frequency source 1, in accordance with the value of the detected temperature.

That is, information which is detected and stored while the frequency source 1 is locked to the external reference frequency signal 10, when the frequency source is in normal use, is utilised when no external reference frequency signal is present to provide a control output 6 to maintain stability of the output of frequency 9.

In more detail, FIG. 2 illustrates the storage of the temperature information and control information in the storage means 7 in accordance with the particularly illustrated embodiment. The temperature and control information is stored in storage means 7 as a plurality of discrete readings in the form of a "look-up" table. Each reading is stored in the form illustrated in FIG. 2 and takes up three bytes of digital memory, byte 1, byte 2 and byte 3.

The first six bits of byte 1 are taken up by data for indicating when the reading was stored, i.e. "age information" 20. The age information is indicative of the number of days for which the particular reading has been stored. It may be implemented by, for example, clearing the age information bits 20 whenever a new reading is stored and updating the age information 20 by one digital bit every day as long as the same reading remains, under control of control means 4.

The last part of byte 1 and the first part of byte 2 contain temperature information 21 as six bits of data. In this particular embodiment readings are only stored in relation to predetermined nominal detected temperature values, which are chosen to provide a reasonable distribution of readings to allow interpolation and extrapolation to produce control signals for detected temperatures which do not actually coincide with any of the nominal temperature values. However, in the calibration step it would not be efficient to wait until the detected temperature of the frequency source coincided exactly with a predetermined nominal temperature value before taking a reading of temperature and control information. Instead, the reading is taken whenever the detected temperature is close enough to the predetermined nominal temperature, i.e. when the detected temperature falls within a predetermined range of a predetermined nominal temperature value. The temperature information 21, therefore, rather than being stored as a direct digital indication of temperature value is stored as an offset value, indicating the temperature offset of the actual detected temperature reading from the predetermined nominal detected temperature value. The nominal temperature value for the particular reading may be determined from the position of the particular reading in the look-up tables (i.e. memory address).

Finally, the rest of byte 2 and all of byte 3 are used to store a D/A setting for the control output 6 to set the output frequency 9 of the frequency source 1. Twelves bits are used to store this setting, providing reasonable range and resolution.

In operation, the calibration step occurs when the external reference frequency signal is being received and the frequency source 1 is operating and the output frequency 9 is locked to the external reference frequency 10. Temperature measuring device 2 measures the temperature of the temperature sensitive components of the frequency source 1, and the temperature reading is input to the control means 4. The control means 4 determines whether the detected temperature value falls close to a predetermined nominal temperature value (i.e. whether it falls in the predetermined range of the predetermined nominal temperature value). If it does not no reading is taken for this temperature. If it does, the age information in any corresponding reading already stored is accessed and if it is determined that the age of the stored data exceeds a predetermined limit then a reading is taken in respect of the present detected temperature and new information is stored in the memory location for the particular predetermined nominal detected temperature value. The information stored is as set out above, i.e. the age information 20 is cleared, the temperature information 21 is stored as an offset from the actual nominal temperature value of the actual detected temperature value and the present reading of the control output 6 is detected by the control means in digital form and stored as control information 22.

It is most desirable that readings only be stored for detected temperature values which fall close to the predetermined nominal temperature values. However, as the age of a particular reading increases it becomes more desirable that that reading be replaced by a newer reading. For old readings, therefore, the allowable offset for the detected temperature from the nominal temperature value may be increased, in order to give a better chance of obtaining a new reading, i.e. the predetermined range about the nominal temperature is varied in an increasing direction as data age increases. This variation in predetermined range may be implemented by known software techniques by the control means 4.

Memory 7 includes a non-volatile programmable memory for storage of the look-up table. As typical non-volatile memories are limited in terms of the allowable number of write cycles for reliable operation (typically 10,000) the rate at which reading updates occur in this particular embodiment are preferably limited to an average update rate of once per day for each memory location.

Over a period of time while the frequency source is operating and is locked to the external frequency source, a number of temperature information and control information readings may be taken and the look-up table may be gradually filled in this way. Any time that the frequency source is operated and is locked to the external reference frequency signal updating of the look-up table will occur in the temperature range encountered during operation. This self-calibration step is automatic and requires no external operations by the user. It is never necessary to send the device back to the factory for recalibration.

Note that when the device is produced it may be initially calibrated merely by subjecting the device to a temperature change across a predetermined range whilst the device is locked to an external frequency source. This will automatically initiate the table for the predetermined temperature range.

This type of self calibration also has the advantage that compensation for aging of the frequency source is automatically carried out as the look-up table is continually updated during its life time. For most voltage controlled crystal oscillators frequency drift due to aging will typically be about 0.0003 ppm per day, so a maximum update rate of 1 per day will be ample to provide reasonable performance and prevent substantial degradtion due to data age.

When the external reference frequency signal is not being received and it is required that the frequency source be brought into operation (e.g. a remote unit in a communications system may be required to transmit even when it is out of range of the external reference frequency signal), the look-up table stored in memory 7 is accessed by control means 4 to provide an appropriate control output 6 for control of frequency source 1 in response to the actual detected temperature value 5 of the frequency source 1.

As only a predetermined plurality of readings are stored in the look-up table, it is quite possible that the actual detected temperature value 5 will not coincide with any of the temperature information values for any of the readings. In order to produce a control output 6 for maintaining stability of the frequency source 1, therefore, the control means 4 applies a control algorithm for extrapolating or interpolating from a plurality of chosen stored readings. In its simplest terms the interpolation may merely be a linear interpretation between the plurality of readings whose temperature information falls in the vicinity of the actual detected temperature value. However, this would not provide satisfactory results in some cases, and it is preferred that the algorithm used will more accurately resemble the frequency/temperature characteristic of the frequency source 1.

The frequency versus temperature characteristic for a typical SC cut crystal voltage controlled oscillator (which may be used as frequency source 1) is known to be cubic. A curve fitting algorithm which fits the cubic polynomial to three or more temperature points will therefore exhibit superior performance to that provided by linear interpolation. Such a curve fitting algorithm could be implemented in software in a manner known to persons skilled in the art. The control means would therefore determine the actual detected temperature value 5, access the memory 7 to obtain a plurality of readings for temperatures close to the actual detected temperature value, and apply the curve fitting algorithm to the plurality of readings. Appropriate interpolation or extrapolation on the curve then produces the correct digital control setting for the control output 6 for the frequency source 1 for the actual detected temperature 5.

The proposed curve fitting method preferably provides well optimized performance by using multi-point curve fitting of data in the vicinity of the required temperature. The use of multi-point fitting will tend to average out the effects of frequency lock errors and Doppler effects (which can cause errors due to the fact that a remote unit, for example, could be moving away from the external frequency reference source when frequency lock is being maintained and a reading is taken). It is unlikely that the same error will affect all points used in the curve fit.

The control means is also arranged to access the age of the readings which it takes to provide the interpolation, and any readings which are over a predetermined age will not be used in the interpolation or extrapolation. This prevents old readings from providing anomalous results. The predetermined age is a matter of choice for the requirements of the particular system involved.

The control algorithm may incorporate strategies to allow for temperature points at the extremes of the look-up table, and cases where insufficient data of acceptable age are available for normal procedures to be applied. Such strategies may easily be implemented in software by persons skilled in the art.

The application of a control algorithm means that the number of predetermined readings which must be stored need not be as great as if one were trying to obtain control information directly from the look-up table.

In a mobile communication system, for example, the remote unit will typically experience temperatures over a certain range cf a period of several days. If the present invention is implemented in such a system and frequency reference transmissions have been received during this period, the remote unit will have compiled an up to date look-up table covering the temperature range encountered. If the remote unit is denied frequency reference information and required to transmit, in all probability the temperature range to be encountered for a period of several hours will not significantly exceed the range encountered during the previous days. Allowing for a limited amount of extrapolation outside of the temperature range for which up to date look-up table information is available, the remote unit will in all probability be able to maintain an adequate level of frequency accuracy for the frequency source.

The performance of the illustrated embodiment of the invention will be dependent upon the resolution and repeatability with which the frequency source setting can be controlled, the resolution and repeatability with which the temperature can be measured, the quality of frequency lock achieved while the look-up table is being compiled (this will depend upon the frequency-lock technique used and any change in external reference frequency due to Doppler effect), the amount of information stored in the look-up table and the method in which this information is used, the influence of temperature rate-of-change effects which distort the static temperature versus frequency characteristics of the frequency source, errors due to the age of data and the effects of parameters such as supply voltage, shock and vibration on frequency source output frequency. Note that within reasonable limits, the absolute accuracy with which the frequency source can be set and the temperature may be measured is unimportant as long as the setting and measurement are repeatable, unambiguous and exhibit sufficient linearity so as not to excessively compromise resolution over the required range.

The resolution with which the frequency source setting can be controlled must be such that the worst case smallest step size is less than the accuracy required for frequency control (this will depend on the application for which the frequency source is to be used).

Resolution with which temperature can be measured must be such that at the steepest slope point on the frequency versus temperature curve, the frequency step corresponding to the worst case smallest resolvable temperature step is smaller than the required accuracy target.

The linearity of the frequency source output versus control setting, and temperature measurement functions are not directly of great significance, except that resolution limits at the worst case point will define the total number of setting or measurement points required, and for a highly non-linear characteristic, this number could be excessive. Both the frequency source setting and temperature measurement functions are desirably highly repeatable to allow the performance potential of the invention to be realised.

Effects which cannot be compensated for by the proposed method are frequency dependence upon supply voltage, frequency change due to shock and vibration, rate of change and hysteresis effects. The frequency source and power supply design can readily provide an adequate degree of power supply immunity. The effects of shock and vibration are less readily controlled, but by suitable choice of crystal, crystal mounting, oscillator design and physical accommodation, effects can be reduced to an acceptable level. Rate of change effects result from temperature gradients appearing across the temperature sensitive elements of the frequency source. These can be reduced by grouping these elements together with good thermal coupling, increasing the thermal mass of the temperature sensitive elements, and thermally isolating the temperature sensitive elements. The extent to which these measures may be implemented are necessarily limited by cost and size constraints and a direct cost capability trade off exists between the maximum rate of change of temperature for which the required level of performance may be achieved and the extent to which performance enhancing measures are applied.

Note that the possibility exists of taking temperature rate-of-change into account in the control algorithm.

The embodiment of FIG. 1 may be implemented by using an 80C32 processor with external EPROM (as control means 4, with D/A converter—see later) and non-volatile programmable EEPROM (as memory means 7). Frequency control of a voltage controlled oscillator as the frequency source is via a serially programmable 12-bit digital to analogue converter controlled by the controller, to generate a voltage which sets the frequency of the voltage controlled oscillator. Temperature of the voltage controlled oscillator is measured by a temperature sensor in intimate thermal contact with the voltage controlled oscillator temperature sensitive elements, and an analogue to digital temperature measurement technique which uses a digital to analogue converter and a comparator to implement software-controlled successive approximation under processor control.

These components can easily be implemented by a person skilled in the art and appropriate software can easily be designed by persons skilled in the art to implement the required algorithms and control processes, in dependence upon the requirements of the system with which the frequency source is being used.

Note that the temperature compensation method need not necessarily be implemented as specifically described in relation to the specifically disclosed embodiment. For example, it is conceivable that temperature information and control information could be recorded in an analogue form (i.e. an analogue plot of temperature against control information) and control information for an actual detected temperature could be read from the analogue.

It is also possible that temperature and control information could be recorded at predetermined times as opposed to in accordance with predetermined nominal temperature values. For example, a detected temperature value and control setting value could be recorded every five seconds and a table of temperature against control setting built up from the recorded values.

Further, in the calibration step it is possible that the reading may only be taken when operation of the frequency source is finished, i.e. after operation has been completed the last values of control signal and temperature before operation ceased (and reception of reference signal ceased) are taken and stored.

Typical oscillator crystals themselves exhibit rate of change and hysteresis effects which degrade performance. These effects may be minimised by choice of a suitable cut of crystal. Where crystal parameters are the limiting factor and performance targets yet to be met, an alternative control strategy to that described in relation to the specific embodiment could be used. Rather than directly accessing the frequency setting required at the current temperature, when no external reference frequency is being received, the remote unit which has suddenly been denied reference frequency information records the current temperature and the last frequency source setting prior to loss of frequency reference information. As the temperature changes, the control algorithm and control means determine a correction to the frequency source setting, rather than determining the absolute frequency source setting for the current temperature. Such an algorithm can again easily be designed by a person skilled in the art. By this means the frequency will be corrected from a known accurate starting point and rate of change and hysteresis effects will initially contribute only second order errors.

The present invention can be used for control of any frequency source, not only frequency sources of remote units in mobile communications systems.

The control setting need not necessarily be a control setting for a voltage controlled oscillator frequency source (i.e. voltage setting) but could be any control parameter used to control the output of the frequency source.

We claim:

1. A method of operating a frequency source, comprising the steps of:
   receiving an external reference frequency signal when available and controlling the frequency source to lock the operating frequency of the frequency source to the reference frequency signal;
   during operation of said frequency source when said external reference frequency is being received, detecting temperature of the frequency source and storing temperature information relating to detected temperatures and control information relating to control settings required to maintain frequency lock for the detected temperatures; and
   when said external reference frequency signal is not being received, detecting the temperature of said frequency source and utilising the stored temperature and control information to provide a control setting in accordance with the detected temperature, for controlling the operating frequency of the frequency source.

2. A method in accordance with claim 1, wherein age information is stored for indicating the age of the stored temperature and control information.

3. A method in accordance with claim 2, wherein the stored temperature and control information is only updated when it is over a predetermined age.

4. A method in accordance with any of claim 1, wherein temperature and control information is only stored in relation to predetermined nominal detected temperature values.

5. A method in accordance with claim 4, wherein temperature and control information is only stored for actual detected temperatures which fall within a predetermined range of said predetermined nominal detected temperature values.

6. A method in accordance with claim 5, wherein when temperature and control information is stored there is also stored offset information relating to the offset between the actual detected temperature value and the predetermined nominal detected temperature value.

7. A method in accordance with claim 5 wherein said predetermined range for any particular nominal temperature value is varied in accordance with the age of the temperature and control information already stored.

8. A method in accordance with claim 7, wherein said predetermined range is increased with increasing age of the stored temperature and control information.

9. A method in accordance with claim 1, wherein, when said external reference frequency signal is not being received, said control setting is provided by interpolating or extrapolating from a plurality of stored temperature information and control information values in accordance with a predetermined algorithm.

10. A method in accordance with claim 9, wherein, if the stored temperature and control information values are over a predetermined age they are not used in interpolation or extrapolation.

11. A method in accordance with claim 9 wherein said predetermined algorithm is a curve fitting algorithm which fits the plurality of values to a characteristic frequency/temperature curve of the frequency source to provide a control setting for the detected temperature.

12. A method in accordance with claim 11, wherein the curve fitting algorithm uses a multi point curve fitting technique utilising stored information values where the temperature information values correspond to temperatures in the vicinity of the actual detected temperature.

13. A method in accordance with claim 1, wherein, when said external reference frequency signal is not being received the last control setting occurring during reception of said external reference frequency control signal is stored and is updated in accordance with control and temperature information in accordance with the actual detected temperature to provide a new control setting.

14. Apparatus for operating a frequency source, comprising;
   means for receiving an external reference frequency signal when available;
   control means for controlling the frequency source to lock the operating frequency thereof to the external reference frequency signal;
   temperature detecting means for detecting the temperature of the frequency source;

storage means for storing, during operation of the frequency source, when said external reference frequency signal is being received, temperature information relating to detected temperatures and control information relating to control settings required to maintain frequency lock for the detected temperatures; and control setting providing means for providing a control setting to control the operating frequency of the frequency source when no external reference frequency signal is being received, said control setting means utilising the stored temperature and control information to provide the control setting in accordance with the detected temperature.

15. Apparatus in accordance with claim 14, wherein there are provided means for determining the age of said stored temperature and control information.

16. Apparatus in accordance with claim 15, wherein there are provided means for preventing updating of stored temperature and control information which is within a predetermined age.

17. Apparatus in accordance with claim 14 wherein the storage means is arranged to store discrete temperature and frequency control readings in relation to predetermined nominal detected temperature values.

18. Apparatus in accordance with claim 17, wherein there are provided means for determining whether a detected temperature value falls within a predetermined range of a predetermined nominal detected temperature value.

19. Apparatus in accordance with claim 18, wherein there are provided means for preventing storage of temperature and control information in relation to said detected temperature value if it does not fall within said range.

20. Apparatus in accordance with claim 18 wherein there are provided means for providing offset information relating to the offset between the actual detected temperature value and the predetermined nominal detected value.

21. Apparatus in accordance with claim 18 wherein there are provided means for varying said predetermined range for any particular nominal temperature value in accordance with the age of the temperature and control information already stored.

22. Apparatus in accordance with claim 21, wherein said means for varying is arranged to increase said predetermined range with increasing age of said stored temperature and control information.

23. Apparatus in accordance with claim 14 wherein said control setting providing means is arranged to provide said control setting by interpolating or extrapolating from a plurality of stored temperature information and control information values in accordance with a predetermined algorithm.

24. Apparatus in accordance with claim 23, wherein said control setting means is arranged to exclude stored temperature and control information values which are over a predetermined age from said interpolation or extrapolation.

25. Apparatus in accordance with claim 23 wherein said predetermined algorithm is a curve fitting algorithm which fits the plurality of values to a characteristic frequency/temperature curve of the frequency source to provide a control setting for the detected temperature.

26. Apparatus in accordance with claim 25, wherein said control setting providing means is arranged to utilise a multi-point curve fitting technique, utilising stored temperature and control information values corresponding to temperatures in the vicinity of the actual detected temperature.

27. Apparatus in accordance with claim 14 wherein there are provided means arranged to store the last control value occurring prior to non-reception of said external reference frequency signal and wherein said control setting providing means is arranged to update the stored control setting value in accordance with stored temperature and control information and the detected temperature to provide the control setting.

* * * * *